(12) United States Patent
Cheng et al.

(10) Patent No.: US 8,923,666 B2
(45) Date of Patent: Dec. 30, 2014

(54) ELECTRICALLY CONTROLLED OPTICAL FUSE AND METHOD OF FABRICATION

(75) Inventors: Kangguo Cheng, Albany, NY (US); Raghavasimhan Sreenivasan, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 13/472,674

(22) Filed: May 16, 2012

(65) Prior Publication Data
US 2013/0306928 A1 Nov. 21, 2013

(51) Int. Cl.
*G02B 6/42* (2006.01)
*G02B 6/10* (2006.01)
*G02B 26/02* (2006.01)

(52) U.S. Cl.
CPC . *G02B 6/10* (2013.01); *G02B 26/02* (2013.01)
USPC ...... 385/16; 257/109; 257/E31.026; 438/133; 438/381

(58) Field of Classification Search
CPC ...... H01L 45/06; G02B 26/02; G02B 27/007; G02B 6/10
USPC ................. 257/109, E31.026; 438/133, 381; 385/16
See application file for complete search history.

(56) References Cited

U.S. PATENT DOCUMENTS

| 6,218,658 | B1 | 4/2001 | Taneda et al. |
| 6,750,530 | B1 | 6/2004 | Klaasen et al. |
| 8,089,105 | B2 | 1/2012 | Barth et al. |
| 2002/0141029 | A1* | 10/2002 | Carlson et al. ................. 359/244 |
| 2006/0197008 | A1* | 9/2006 | Kato et al. ................. 250/214.1 |
| 2011/0298087 | A1 | 12/2011 | Pellizzer et al. |
| 2012/0069685 | A1 | 3/2012 | Ide et al. |

FOREIGN PATENT DOCUMENTS

| EP | 943954 | A2 | 9/1999 | |
| EP | 2369385 | A2 | 9/2011 | |
| JP | 09-146056 | * | 6/1997 | ............. G01F 1/025 |
| JP | 9146056 | | 6/1997 | |
| JP | 11274547 | | 10/1999 | |
| JP | 11281842 | | 10/1999 | |
| JP | 2004096064 | A | 3/2004 | |

* cited by examiner

*Primary Examiner* — Kevin M Picardat
*Assistant Examiner* — Jamie C Niesz
(74) *Attorney, Agent, or Firm* — Joseph P. Abate; Howard M. Cohn

(57) ABSTRACT

Embodiments of the present invention provide an electrically controlled optical fuse. The optical fuse is activated electronically instead of by the light source itself. An applied voltage causes the fuse temperature to rise, which induces a transformation of a phase changing material from transparent to opaque. A gettering layer absorbs excess atoms released during the transformation.

8 Claims, 7 Drawing Sheets

ELECTRICALLY CONTROLLED OPTICAL FUSE AND METHOD OF FABRICATION

FIELD OF THE INVENTION

The present invention relates generally to semiconductors, and more particularly, to an electrically controlled optical fuse and method of fabrication.

BACKGROUND

Optical semiconductor circuits, comprising a light sensor and a light source formed of semiconductor substrates, and disposed in an optical path allow optical propagation of signals within a semiconductor device. For the purposes of device protection, or reconfiguration, it is desirable to have an optical fuse to enable permanent interruption of the optical signal propagation.

SUMMARY

In one embodiment a semiconductor structure is provided. The semiconductor structure comprises a phase changing material region, a gettering region disposed adjacent to the phase changing material region, a metal region disposed adjacent to the gettering region, a plurality of contacts electrically connected to the metal region. The phase changing material region is disposed in an optical path between a light source and a light sensor.

In another embodiment, a semiconductor structure is provided. The structure comprises a phase changing material region comprised of Ta3N5, a gettering region comprised of titanium, disposed adjacent to the phase changing material region, a tungsten region disposed adjacent to the gettering region, a plurality of contacts electrically connected to the tungsten region. The phase changing material region is disposed in an optical path between a light source and a light sensor.

In another embodiment, a method of fabricating an optical fuse is provided. The method comprises depositing a metal region on a light sensor substrate, forming a cavity in the metal region to expose a portion of the light sensor substrate, depositing a gettering layer on the metal region, filling the cavity with a phase changing material, planarizing to the metal region, depositing a light source substrate on the metal region, whereby the phase changing material is in an optical path between the light sensor substrate and the light source substrate, and forming a plurality of contacts in the metal region.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
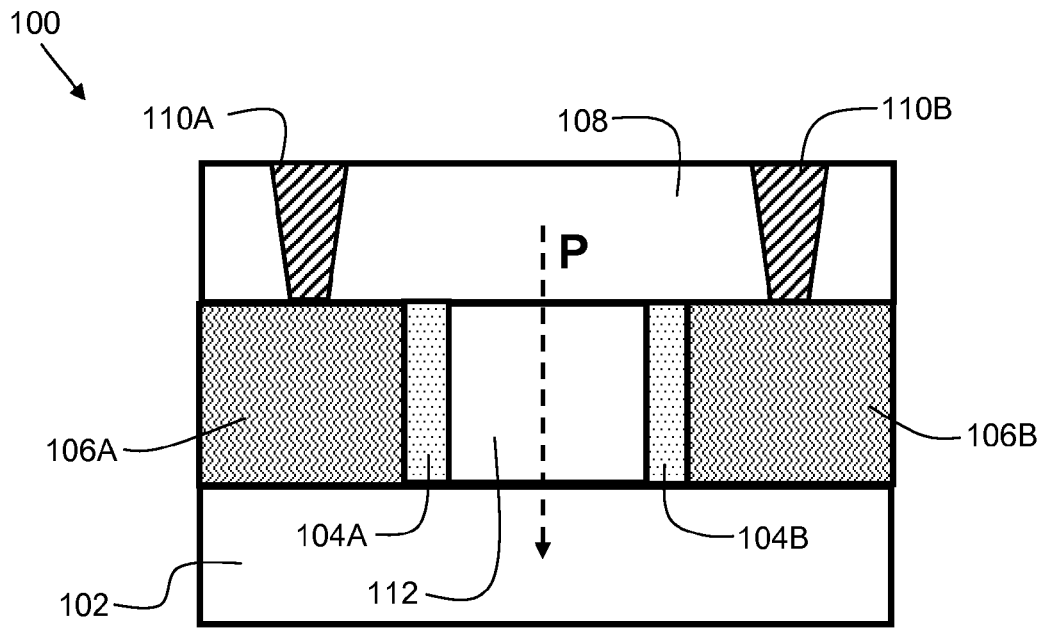

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is an electrically controlled optical fuse in accordance with an embodiment of the present invention in the non-blown state.

Figure 2:
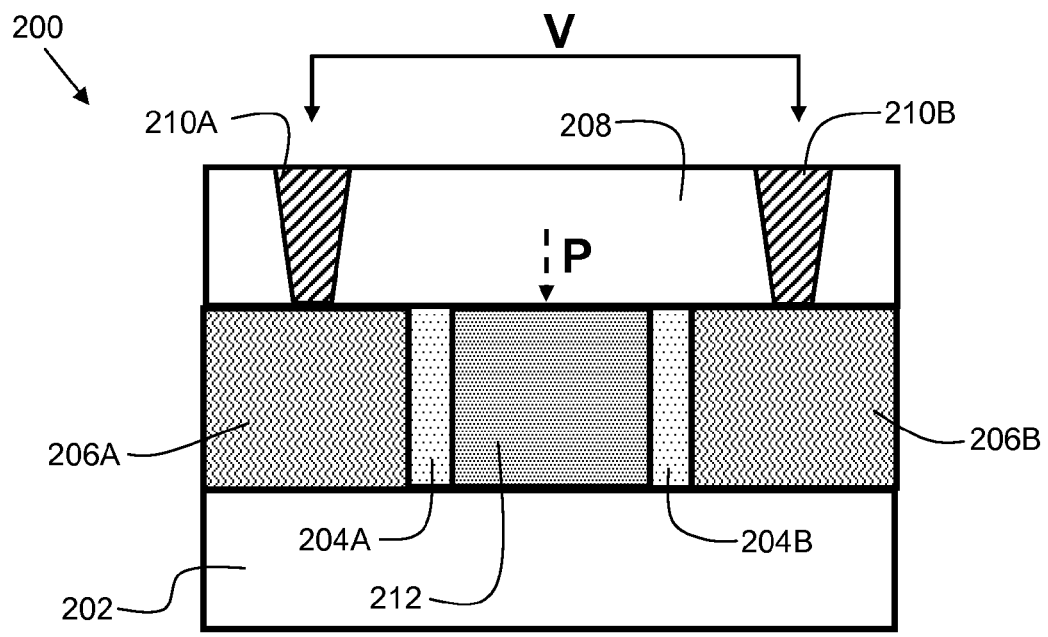

FIG. 2 is an electrically controlled optical fuse in accordance with an embodiment of the present invention in the blown state.

Figure 3:

FIG. 3 is a semiconductor structure at a starting point for a method of fabrication in accordance with an embodiment of the present invention.

Figure 4:
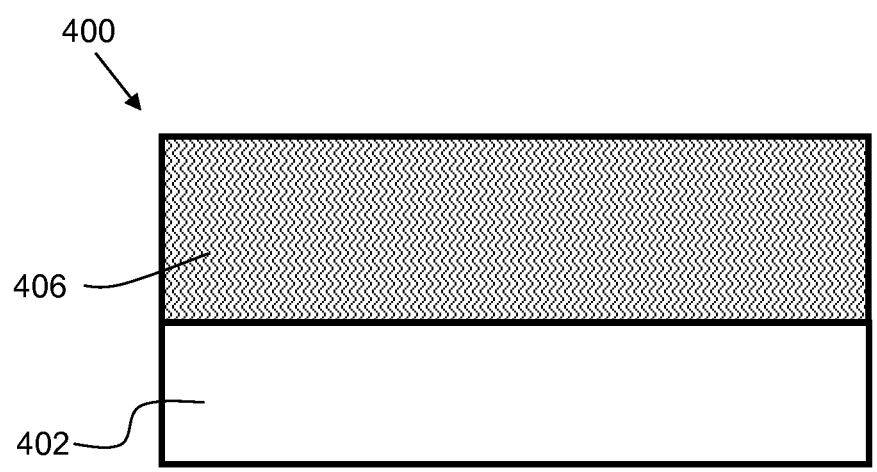

FIG. 4 is a semiconductor structure after a subsequent step of metal region deposition.

Figure 5:
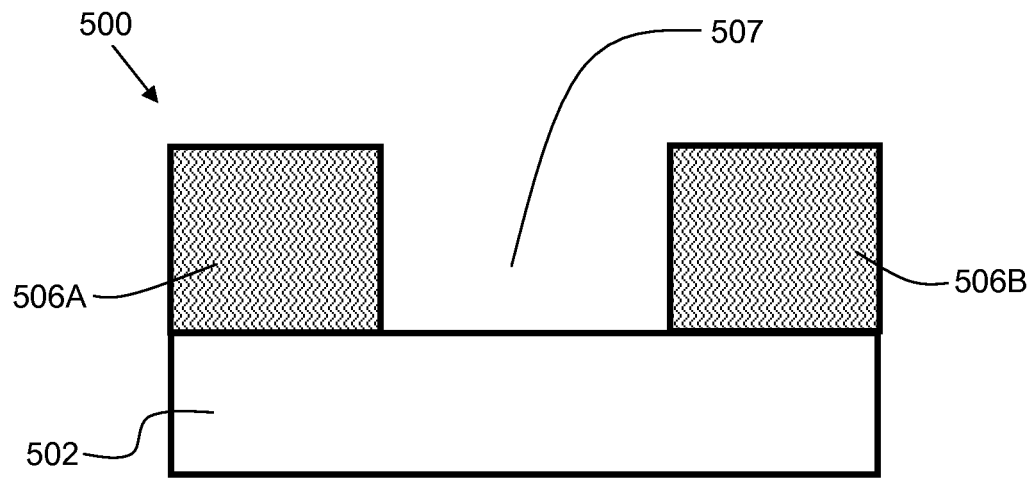

FIG. 5 is a semiconductor structure after a subsequent step of cavity formation.

Figure 6:
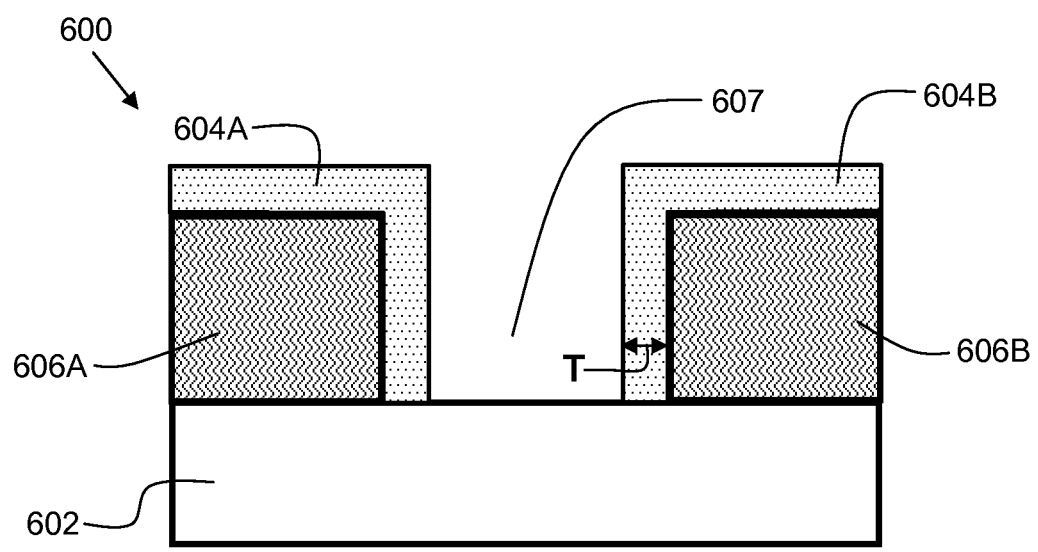

FIG. 6 is a semiconductor structure after a subsequent step of depositing a gettering layer.

Figure 7:
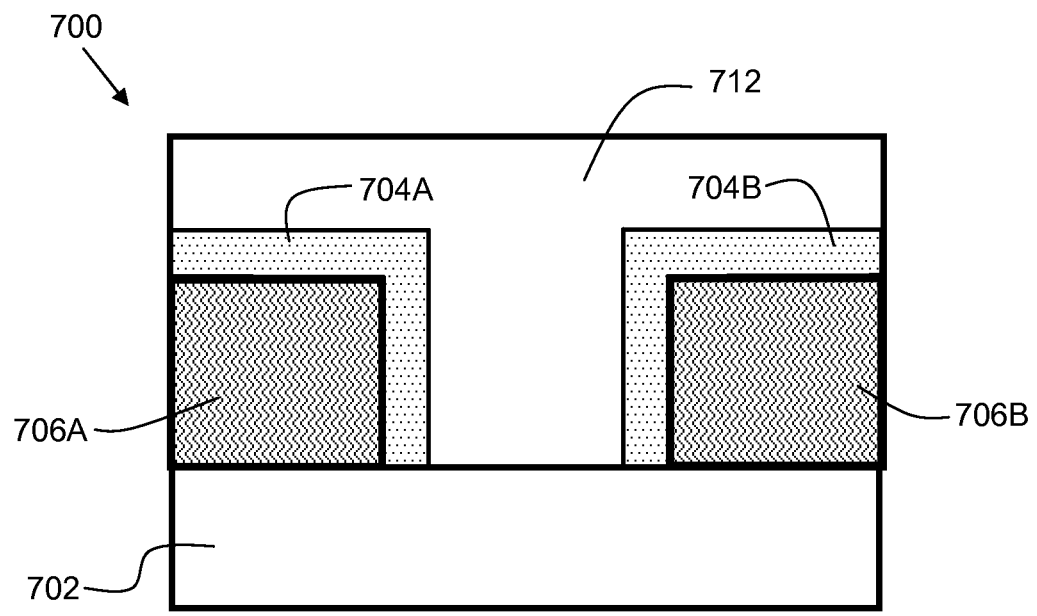

FIG. 7 is a semiconductor structure after a subsequent step of depositing a phase changing material.

Figure 8:
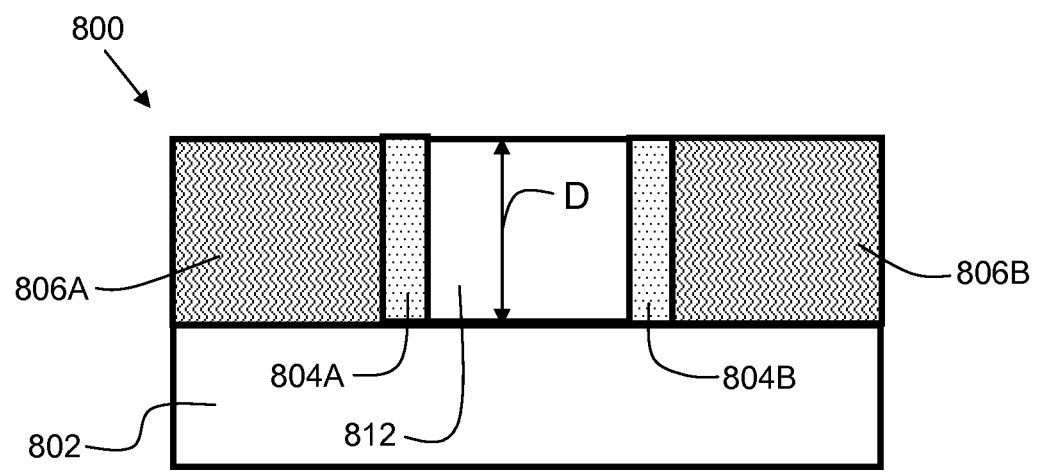

FIG. 8 is a semiconductor structure after a subsequent step of depositing a planarization.

Figure 9:
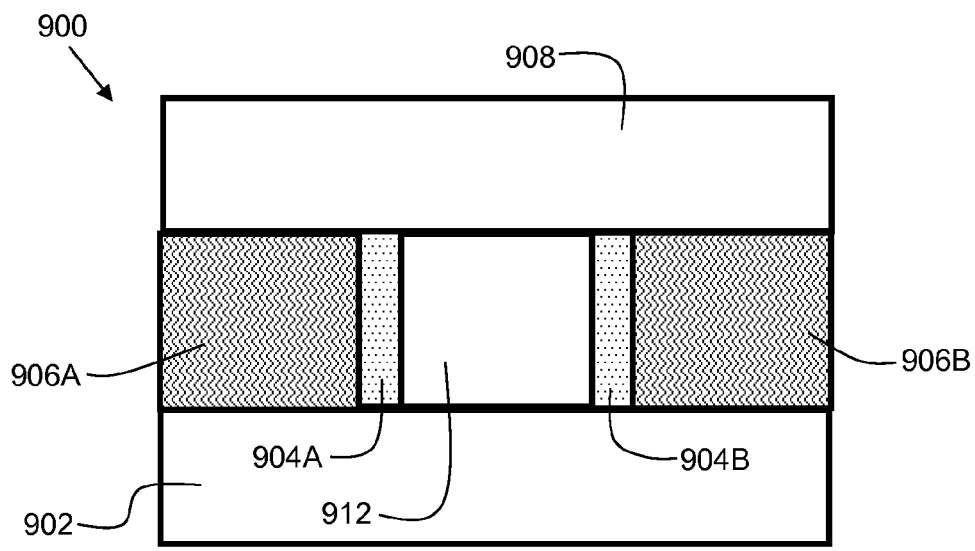

FIG. 9 is a semiconductor structure after a subsequent step of depositing a light source substrate.

Figure 10:
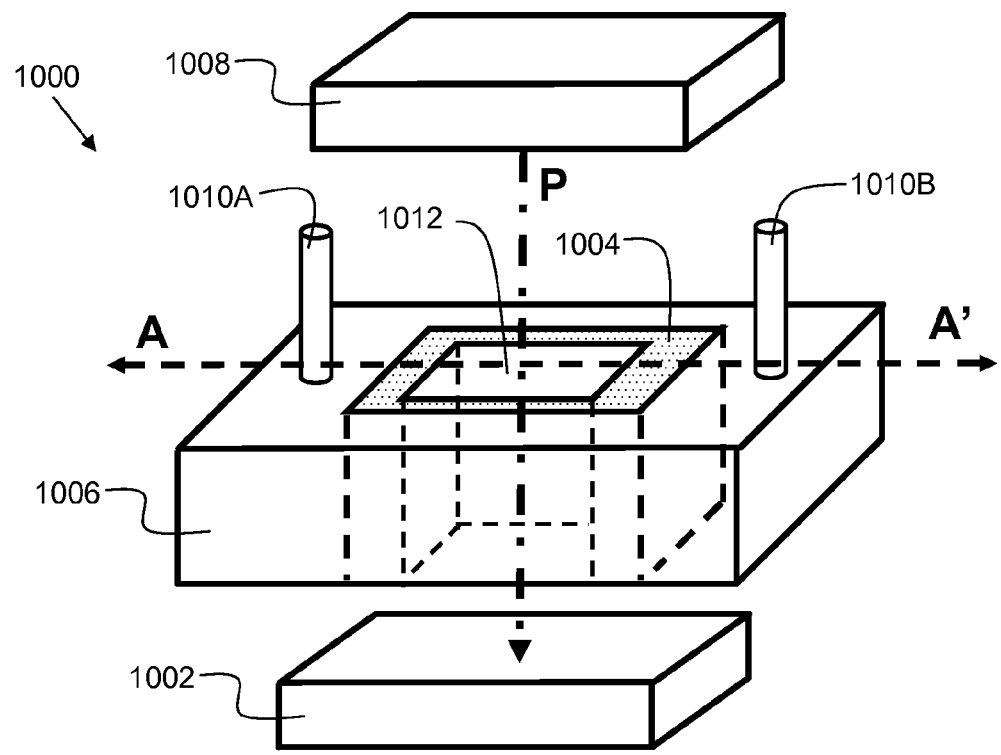

FIG. 10 is a perspective view of an electrically controlled optical fuse in accordance with an embodiment of the present invention.

Figure 11:
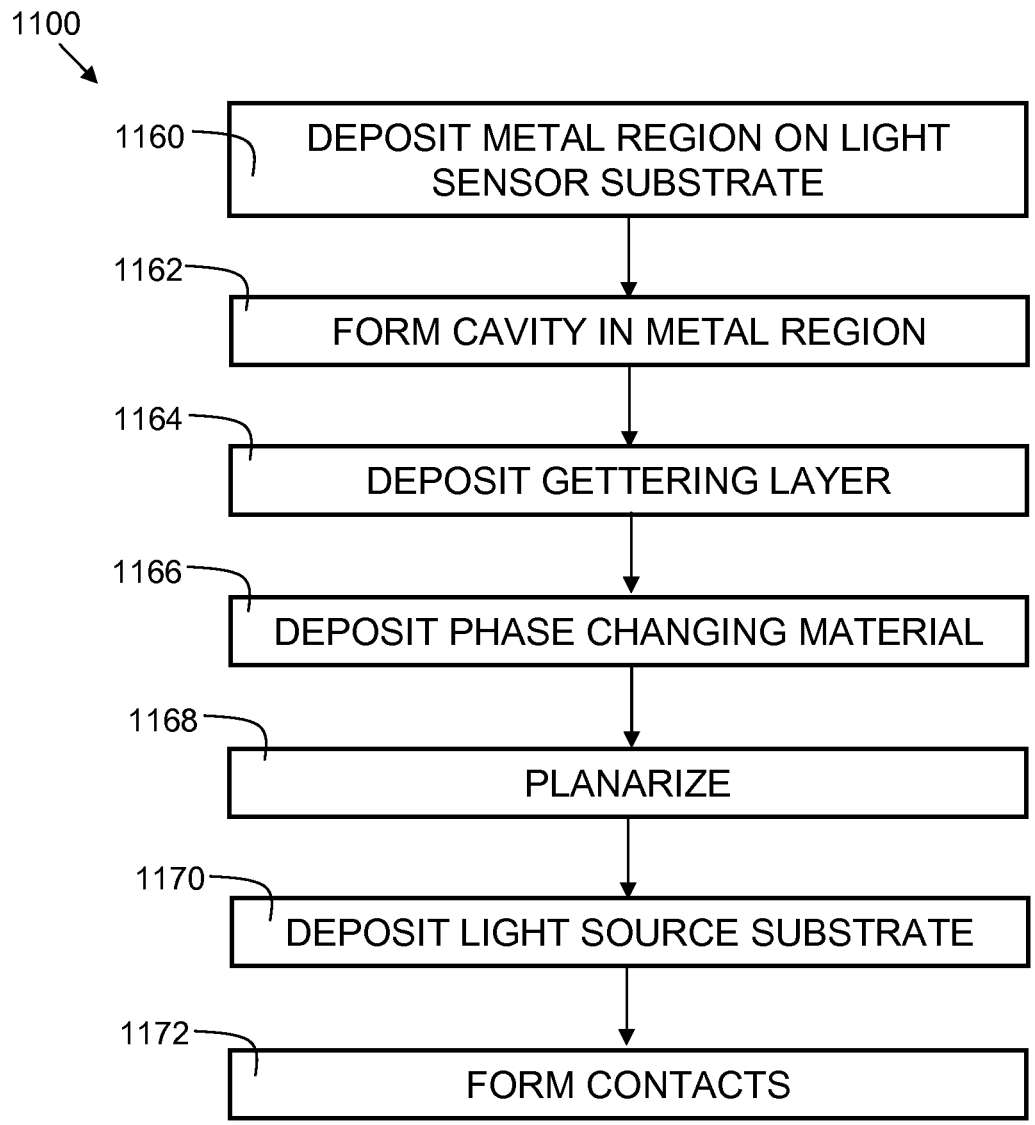

FIG. 11 is a flowchart indicating process steps for a method in accordance with an embodiment of the present invention.

Figure 12:
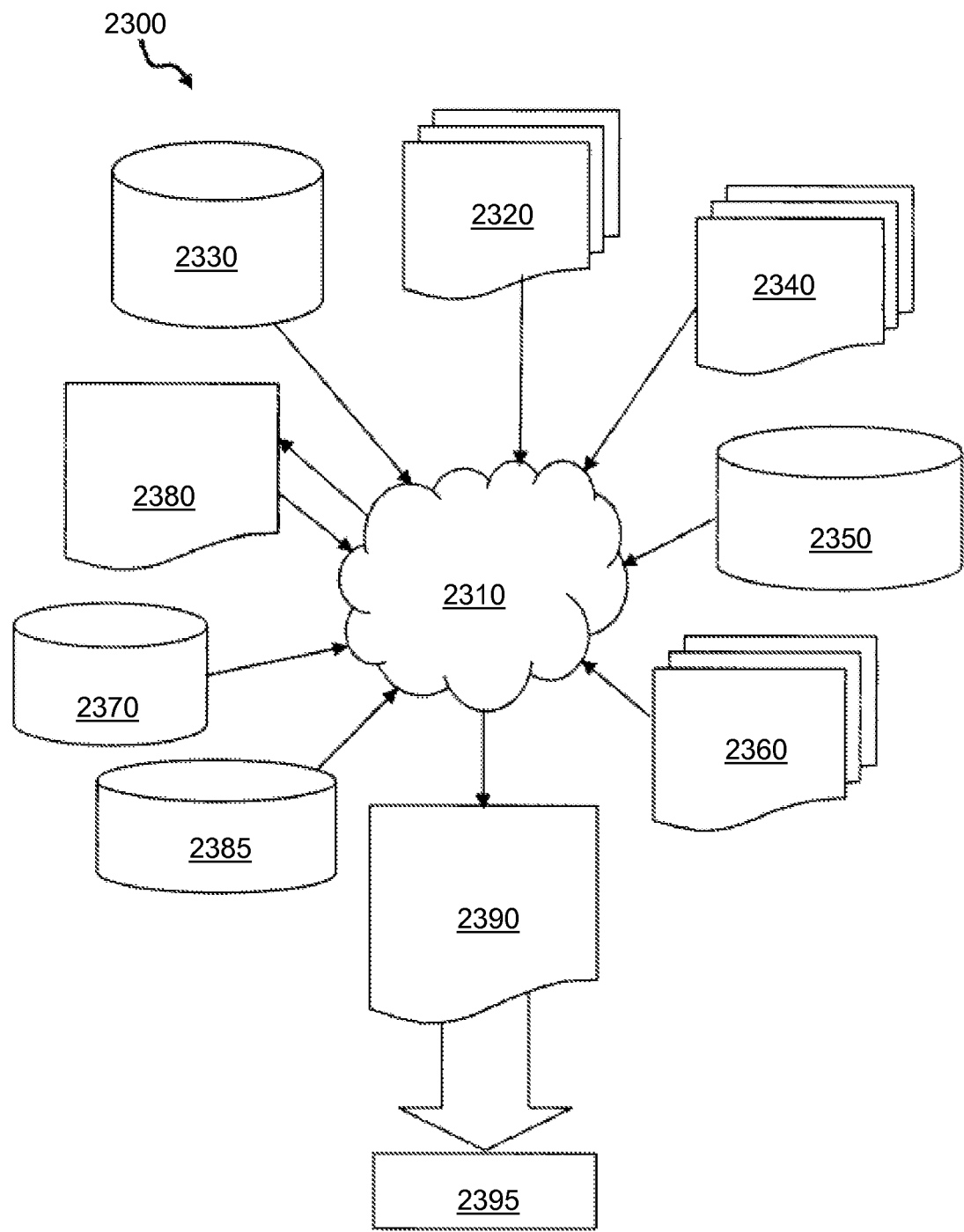

FIG. 12 shows a block diagram of an exemplary design flow.

DETAILED DESCRIPTION

Embodiments of the present invention provide an electrically controlled optical fuse. The optical fuse is activated electronically instead of by the light source itself. This allows circuit implementations in which an optical circuit is protected by asserting an electrical signal, rather than by the intensity of light passing through the optical fuse. In an optically controlled optical fuse, the intensity of the light (photon energy) passing through the fuse triggers the fuse. In embodiments of the present invention, the optical fuse is blown without the need for the intensity of the light to exceed a predetermined value. For example, the optical fuse can be blown when a certain condition (e.g. a tampering condition, or a safety interlock violation) is detected. FIG. 1 is a semiconductor structure 100 comprising an electrically controlled optical fuse in accordance with an embodiment of the present invention in the non-blown state. Light sensor substrate 102, for example, could be a circuit in one part of the chip that should be shielded from the optical interconnect signal generated from another part of the chip. As an example, such a circuit may include a floating body n-FET SOI NMOS transistor device that provides an optical detection function at normal communication wavelengths, including a detection response for light sources.

A phase changing material region 112 is disposed on the light sensor substrate 102. A gettering region 104A and 104B are disposed adjacent to the phase changing material 112. A metal region 106A and 106B is disposed adjacent to the gettering regions 104A and 104B, respectively. A light source substrate 108 is disposed above the metal regions 106A and 106B. Light source substrate 108 may comprise a region of the chip generating the optical signal (for example, a semiconductor laser array formed on a p-InP substrate) or an external source of light input into the chip. A plurality of contacts (110A and 110B) are connected to the metal regions (106A and 106B, respectively).

Photons travel from light source substrate 108 to light sensor substrate 102 via optical path P. Phase changing material 112 may include, but is not limited to, TaN3, Hf3N4, and Zr3N4. These materials pass photons while in a transparent state. The phase changing material 112 is transformed into an opaque state by joule heating. The gettering region 104A and 104B trap atoms released during the phase change from transparent to opaque. In some embodiments, the material for gettering regions 104A and 104B may comprise titanium, aluminum, or zirconium. In one embodiment, the metal regions 106A and 106B may be comprised of tungsten. In another embodiment, the metal regions 106A and 106B may be comprised of titanium nitride.

FIG. 2 is a semiconductor structure 200 comprising an electrically controlled optical fuse in accordance with an embodiment of the present invention in the blown state. As stated previously, often, similar elements may be referred to by similar numbers in various figures (FIGs) of the drawing, in which case typically the last two significant digits may be the same, the most significant digit being the number of the drawing figure (FIG). Hence, light sensor substrate 202 of FIG. 2 is similar to light sensor substrate 102 of FIG. 1, and light source substrate 208 of FIG. 2 is similar to light source substrate 208 of FIG. 1, for example. Phase changing material 212 is in the opaque state, and hence, the optical path P terminates at the phase changing material 212 and does not reach the light sensor substrate 202. To change the state of the phase changing material from transparent (as in 112 of FIG. 1) to opaque (as in 212 of FIG. 2), a voltage V is applied between contact 210A and contact 210B. In one embodiment, the voltage is in the range of about two volts to about four volts, and may be applied for a duration ranging from about 20 milliseconds to about 100 milliseconds.

In the case where the phase changing material 112 is comprised of Ta3N5, when the voltage V is applied, the metal regions 206A and 206B are heated (due to joule heating) and this in turn heats the phase changing material. Ta3N5 has an optical bandgap of about 2.5 eV, which allows photons with a photon energy of 2.5 eV or less to pass through the material.

Heat caused by application of the voltage V causes a phase transformation in the Ta3N5 that causes it to become opaque TaN. This process releases nitrogen from the Ta3N5, and the excess nitrogen is trapped in the gettering regions 204A and 204B. The phase change is permanent, so even when the voltage V is no longer applied, the phase changing material 212 remains as opaque TaN.

In the case where the phase changing material is Hf3N4, the heat causes the material to change to HfN. In the case where the phase changing material is Zr3N4, the heat causes the material to change to ZrN.

The heat generated by the applied voltage V may be in the range of about 400 degrees Celsius to about 600 degrees Celsius, for a time period ranging from about 20 milliseconds to about 1000 milliseconds.

FIG. 3 is a semiconductor structure 300 at a starting point for a method of fabrication in accordance with an embodiment of the present invention. A light sensor substrate 302 is used as the starting point. The light sensor substrate may be comprised of silicon.

FIG. 4 is a semiconductor structure 400 after a subsequent step of depositing a metal region 406. The metal region 406 may be tungsten, and may be deposited by chemical vapor deposition (CVD), plasma enhanced chemical vapor deposition (PECVD), or other suitable method. Alternatively, titanium nitride (TiN) may be used for metal region 406.

FIG. 5 is a semiconductor structure 500 after a subsequent step of forming a cavity 507 to expose a portion of the light sensor substrate 502. The cavity 507 may be formed via industry-standard patterning methods, such as masking and etching. In one embodiment, a reactive ion etch (RIE) process is used.

FIG. 6 is a semiconductor structure 600 after a subsequent step of depositing a gettering layer (604A, and 604B). The deposition of the gettering layer may be performed via chemical vapor deposition (CVD) or atomic layer deposition (ALD), or other suitable method. A follow-up RIE may be used to remove any gettering material from the bottom of the cavity, if needed. In one embodiment, the thickness T of the gettering layer ranges from about 10 nanometers to about 20 nanometers. In some embodiments, the gettering layer (604A, 604B) may comprise titanium, zirconium, or aluminum. The gettering layer serves to trap impurities that might otherwise damage the chip.

FIG. 7 is a semiconductor structure 700 after a subsequent step of depositing a phase changing material 712. The phase changing material 712 may be deposited by chemical vapor deposition (CVD), plasma enhanced chemical vapor deposition (PECVD), or other suitable method. In some embodiments, the phase changing material 712 is comprised of Ta3N5, Hf3N4, or Zr3N4.

FIG. 8 is a semiconductor structure 800 after a subsequent step of planarizing to the metal region (compare with FIG. 7). In some embodiments, the planarizing may be performed with a chemical mechanical polish (CMP) process. In some embodiments, the depth D of the phase changing material 812 ranges from about 10 nanometers to about 50 nanometers.

FIG. 9 is a semiconductor structure 900 after a subsequent step of depositing a light source substrate 908. In some embodiments, the light source substrate may comprise on-chip circuitry with an optical output, or an external optical source, such as a laser.

FIG. 10 is a perspective view of a semiconductor structure 1000 which is similar to that shown in FIG. 1. Note that FIGS. 1-9 show cross section views as viewed along line A-A' of FIG. 10. As shown in FIG. 10, metal region 1006 surrounds gettering region 1004, which in turn surrounds phase changing material 1012. Contacts 1010A and 1010B are electrically connected to metal region 1006. In some embodiments, metal region 1006 and contacts 1010A and 1010B are comprised of tungsten. Light sensor substrate 1002 is disposed below the phase changing material 1012, and light source substrate 1008 is disposed above the phase changing material 1012. Light source substrate 1008 emits photons along optical path P, passing though the phase changing material 1012, so that the photons reach the light sensor substrate 1002. When a sufficient voltage is applied to contacts 1010A and 1010B, the phase changing material 1012 becomes opaque, thus acting as an electrically controlled optical fuse.

Note that while embodiments illustrated herein show the light sensor substrate below the phase changing material, it is also possible, and within the scope of the present invention, to have the light source substrate below the phase changing material, and the light sensor substrate above the phase changing material. Furthermore, when fabricating structures in accordance with embodiments of the present invention, it is possible to deposit the fuse components (metal region, gettering layer, and phase changing material) onto a light source substrate, and then deposit a light sensor substrate on top of the fuse components. Furthermore, while some illustrated embodiments herein show the light source substrate and light sensor substrate in direct physical contact with the phase changing material, it is also possible, and within the scope of the present invention, that the light sensor substrate and/or the light source substrate are not in direct physical contact with the phase changing material, as illustrated with FIG. 10. In some cases, there may be a void (air gap or vacuum gap) between the phase changing material and the light sensor and/or light source substrates. Furthermore, there may be one or more intermediate transparent layers between the phase changing material and the light sensor and/or light source substrates.

FIG. 11 is a flowchart 1100 indicating process steps for a method in accordance with an embodiment of the present invention. In process step 1160, a metal region is deposited on a light sensor substrate (see 406 of FIG. 4). In one embodiment, the metal region is comprised of tungsten. In process step 1162, a cavity is formed in the metal region (see 507 of FIG. 5). The cavity may be formed via a reactive ion etch (RIE) process. In process step 1164 a gettering layer is deposited (see 604A, 604B of FIG. 6). In some embodiments, the gettering layer may comprise titanium, aluminum, or zirconium. In some embodiments, the gettering layer may be deposited via atomic layer deposition (ALD) or chemical vapor deposition (CVD). In process step 1166, the phase changing material is deposited (see 712 of FIG. 7). In some embodiments, the phase changing material is deposited via chemical vapor deposition. In process step 1168 the structure is planarized to the metal region (compare FIG. 8 with FIG. 7). In some embodiments, the planarizing may be performed via a chemical mechanical polish (CMP) process. In process step 1170, a light source substrate is deposited (see FIG. 9). In process step 1172, contacts are formed. This may comprise etching trenches in the light source substrate and then filling the trenches with a conductive material such as tungsten, resulting in the structure 100 of FIG. 1.

FIG. 12 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-11. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-11. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 2310 preferably employs and incorporates hardware and/or software modules for synthesizing, translating, or otherwise processing a design/simulation functional equivalent of the components, circuits, devices, or logic structures shown in FIGS. 1-11 to generate a Netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-transitory, non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 2310 may include using a variety of inputs; for example, inputs from library elements 2330 which may house a set of commonly used elements, circuits, and devices, including models, layouts, and symbolic representations, for a given manufacturing technology (e.g., different technology nodes, 32 nm, 45 nm, 90 nm, etc.), design specifications 2340, characterization data 2350, verification data 2360, design rules 2370, and test data files 2385 (which may include test patterns and other testing information). Design process 2310 may further include, for example, standard circuit design processes such as timing analysis, verification, design rule checking, place and route operations, etc. One of ordinary skill in the art of integrated circuit design can appreciate the extent of possible electronic design automation tools and applications used in design process 2310 without deviating from the scope and spirit of the invention. The design structure of the invention is not limited to any specific design flow.

Design process 2310 preferably translates an embodiment of the invention as shown in FIGS. 1-11, along with any additional integrated circuit design or data (if applicable), into a second design structure 2390. Design structure 2390 resides on a storage medium in a data format used for the exchange of layout data of integrated circuits (e.g. information stored in a GDSII (GDS2), GL1, OASIS, or any other suitable format for storing such design structures). Design structure 2390 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-11. Design structure 2390 may then proceed to a stage 2395 where, for example, design structure 2390: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
a phase changing material region;
a gettering region disposed adjacent to the phase changing material region;
a metal region disposed adjacent to the gettering region;
a plurality of contacts electrically connected to the metal region; and
wherein the phase changing material region is disposed in an optical path between a light source and a light sensor and wherein the phase changing material region is selected from the group comprised of $Ta_3N_5$, $Zr_3N_4$ and $Hf_3N_4$.

2. A semiconductor structure comprising:
a phase changing material region;
a gettering region disposed adjacent to the phase changing material region;
a metal region disposed adjacent to the gettering region;
a plurality of contacts electrically connected to the metal region; and
wherein the phase changing material region is disposed in an optical path between a light source and a light sensor and wherein the gettering region is selected from the group comprised of aluminum, zirconium and titanium.

3. The structure of claim 2, wherein the metal region disposed adjacent to the gettering region is comprised of tungsten.

4. The structure of claim 2, wherein the metal region disposed adjacent to the gettering region is comprised of titanium nitride.

5. A semiconductor structure comprising:
a phase changing material region comprised of $Ta_3N_5$;
a gettering region comprised of titanium, disposed adjacent to the phase changing material region;
a tungsten region disposed adjacent to the gettering region;
a plurality of contacts electrically connected to the tungsten region; and
wherein the phase changing material region is disposed in an optical path between a light source and a light sensor.

6. The structure of claim 5, wherein the plurality of contacts are comprised of tungsten.

7. The structure of claim 5, wherein the gettering region has a thickness ranging from about 10 nanometers to about 20 nanometers.

8. The structure of claim 5, wherein the phase changing material region has a depth ranging from about 25 nanometers to about 100 nanometers.

* * * * *